United States Patent
Wada et al.

(10) Patent No.: US 10,042,092 B2
(45) Date of Patent: Aug. 7, 2018

(54) HEAT-INSULATION MATERIAL AND PRODUCTION METHOD THEREOF

(71) Applicant: Panasonic Intellectual Property Management Co., Ltd., Osaka (JP)

(72) Inventors: Tooru Wada, Osaka (JP); Shigeaki Sakatani, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 15/642,902

(22) Filed: Jul. 6, 2017

(65) Prior Publication Data

US 2018/0024281 A1 Jan. 25, 2018

(30) Foreign Application Priority Data

Jul. 22, 2016 (JP) .................. 2016-144477
Apr. 24, 2017 (JP) .................. 2017-085301

(51) Int. Cl.
*H05K 1/00* (2006.01)
*H05K 1/18* (2006.01)
(Continued)

(52) U.S. Cl.
CPC ............ *G02B 5/0273* (2013.01); *B32B 5/022* (2013.01); *B32B 5/22* (2013.01); *C01B 33/1435* (2013.01); *C01B 33/152* (2013.01); *C01B 33/158* (2013.01); *C01B 33/159* (2013.01); *C01B 33/1546* (2013.01); *C01B 33/16* (2013.01); *D06M 11/79* (2013.01); *G02B 5/021* (2013.01); *H05K 1/0201* (2013.01); *B32B 2250/02* (2013.01); *B32B 2250/03* (2013.01); *B32B 2255/02* (2013.01); *B32B 2255/20* (2013.01); *B32B 2260/021* (2013.01);
(Continued)

(58) Field of Classification Search
CPC . C01B 33/1435; C01B 33/1546; C01B 33/16; D06M 11/79; D06M 2400/02; G02B 5/021; G02B 5/0273; H05K 1/0201; H05K 2201/062
See application file for complete search history.

(56) References Cited

U.S. PATENT DOCUMENTS 5,795,556 A * 8/1998 Jansen .................. C01B 33/16
423/338
6,632,771 B1 * 10/2003 Maekawa .......... B01D 53/8628
502/239
(Continued)

FOREIGN PATENT DOCUMENTS

JP 3854645 B 12/2006

*Primary Examiner* — Yuriy Semenenko
(74) *Attorney, Agent, or Firm* — Panasonic IP Management; Kerry S. Culpepper (57) ABSTRACT

A heat-insulation material does not cause deterioration in heat-insulation performance and any loss of components included therein, and possesses an excellent radiation-preventing function. The heat-insulation material includes: a first heat-insulation layer that includes a first silica xerogel and a first radiation-preventing material; and a third heat-insulation layer that includes a third silica xerogel and second fibers, wherein the first heat-insulation layer and the third heat-insulation layer are layered. An electronic device includes the heat-insulation material. Yet further disclosed is a method for producing the heat-insulation material.

10 Claims, 5 Drawing Sheets

(51) Int. Cl.
    *H05K 7/00*     (2006.01)
    *G02B 5/02*     (2006.01)
    *C01B 33/143*   (2006.01)
    *C01B 33/154*   (2006.01)
    *C01B 33/16*    (2006.01)
    *D06M 11/79*    (2006.01)
    *H05K 1/02*     (2006.01)
    *B32B 5/02*     (2006.01)
    *B32B 5/22*     (2006.01)
    *C01B 33/152*   (2006.01)
    *C01B 33/158*   (2006.01)
    *C01B 33/159*   (2006.01)

(52) U.S. Cl.
    CPC ... *B32B 2260/023* (2013.01); *B32B 2262/101* (2013.01); *B32B 2262/103* (2013.01); *B32B 2262/108* (2013.01); *B32B 2264/102* (2013.01); *B32B 2307/304* (2013.01); *B32B 2307/732* (2013.01); *B32B 2457/00* (2013.01); *D06M 2400/02* (2013.01); *H05K 2201/062* (2013.01)

(56) References Cited

U.S. PATENT DOCUMENTS

| | | | | |
|---|---|---|---|---|
| 2006/0167147 | A1* | 7/2006 | Asgari | A61K 9/0024 524/174 |
| 2006/0178264 | A1* | 8/2006 | Kameshima | B32B 27/10 502/439 |
| 2006/0226758 | A1* | 10/2006 | Sofue | C09D 183/04 313/483 |
| 2014/0376191 | A1* | 12/2014 | Hwang | F28F 13/003 361/720 |
| 2015/0077957 | A1* | 3/2015 | Sakatani | B32B 7/12 361/757 |

* cited by examiner

HEAT-INSULATION MATERIAL AND PRODUCTION METHOD THEREOF

TECHNICAL FIELD

The technical field relates to a heat-insulation material, and a production method thereof. In particular, the technical field relates to a heat-insulation material that is used in a high-temperature environment, and a production method thereof.

BACKGROUND

Silica aerogels differs from general-purpose heat-insulation materials such as urethane forms (polyurethane; PU), expanded polystyrene (EPS), and vacuum insulation panels (VIPs), in that their heat-insulation performance hardly changes across the ages. Furthermore, since silica aerogels have a heat resistance of 400° C. or higher, they have attracted a great deal of attention as next-generation heat-insulating materials.

Silica aerogels are superior to existing heat-insulation materials in terms of resistance to age-related deteriorations, and heat resistance, and have excellent, heat conductivity around 15 mW/mK. However, in silica aerogels, network structures in which a string of silica particles on the scale of several tens of nanometers are beaded by point contact, and therefore, silica aerogels do not have sufficient mechanical strength. In order to cope with such fragility, there have been studies in which improvement of mechanical strength of silica aerogels is attempted based on combination with fibers, unwoven fabrics, resins, etc.

Heat-insulation materials made of silica aerogels easily produce radiation heat on the surfaces of the silica particles having a high radiation factor (about 0.95), under a high-temperature environment, e.g., above 100° C.

Consequently, influences of the radiation heat transmission become dominant over heat insulation properties obtained by pores possessed by the silica particles, and thus, there are tendencies that silica aerogels lose sufficient heat-insulation properties (apparent heat conductivities of the heat-insulation materials become larger). That is, silica aerogels absorb infrared rays from the outside, and then, release them to the outside. Accordingly, the silica aerogels transmit heat therethrough.

As one conventional art that addresses the above problem, there is a publication of Japanese Patent No. 3,854,645. A substrate that is obtained by attaching, onto unwove fabrics or a mat-shaped fiber material, silica aerogels having silica frameworks. At least one part of a surface of the substrate is seated with a coating layer including alumina (having low a radiation factor). This coating layer suppress the influences of the radiation heat transmission.

SUMMARY

However, Japanese Patent No. 3,854,645 does not disclose how the filler is coated with the coating layer, and is continuously retained in the heat-insulation material. If the coating layer is somehow defective, the filler would easily get detached therefrom, and effects to prevent the radiation would be deteriorated.

Therefore, an object of the disclosure is to provide a heat-insulation material that does not cause any deterioration in the heat-insulation performance, and any loss of components included therein, and in which a radiation-preventing material is effectively combined to thereby successfully prevent the radiation. A further object of the disclosure is to provide an electronic device including the heat-insulation material. Yet another object of the disclosure is to provide a method for producing the heat-insulation material.

In order to achieve the above-mentioned objects, according to the first aspect of the disclosure, provided is a heat-insulation material, including: a first beat-insulation layer that includes a fist silica xerogel and a first radiation-preventing material; and a third heat-insulation layer that includes a third silica xerogel and second fibers, wherein the first heat-insulation layer and the third heat-insulation layer are layered.

According to a second aspect of the disclosure, provided is an electronic device, including: a circuit substrate; a heat-generating component that is placed on the circuit substrate; and the above heat-insulation material according to the first aspect of the disclosure, wherein the heat-insulation material is placed such that the first heat-insulation layer faces the heat-generating component.

According to the third aspect of the disclosure, provided is a method for producing a heat-insulation material, including: (i) converting water glass or an silicic acid solution to a sol (a), and, providing a sol (b) that is prepared from the sol (a) and that includes a radiation-preventing material (p), and a sol (c) that is prepared from the sol (a) and that does not include the radiation-preventing material (p); (ii) causing the sol (b) and the sol (c) to penetrate into at least one piece of unwoven fabrics; (iii) converting the sol (b) and the sol (c) into gels; (iv) aging the gels; (v) soaking the gels in an acidic aqueous solution; (vi) hydrophobizing the gels; and (vi) drying the gels.

According to the disclosure, a radiation-preventing material is provided in a surface layer that will be located around a heat source and that is a part of the heat-insulation material, in order to prevent deterioration in heat-insulation performance of the heat-insulation material, and loss of components included therein. Accordingly, scattering of infrared rays does not occur in the surface-layer part, and thus, the infrared rays do not penetrate into the internal area of the heat-insulation material. As a result, the heat-insulation material according to the disclosure will effectively suppress heat transmission, and will have a superior radiation-preventing function, and high heat-insulation performance.

DESCRIPTION OF EMBODIMENTS

Hereinafter, embodiments will be described with reference to the drawings.

Structure of a Heat-Insulation Material 100

Figure 1:
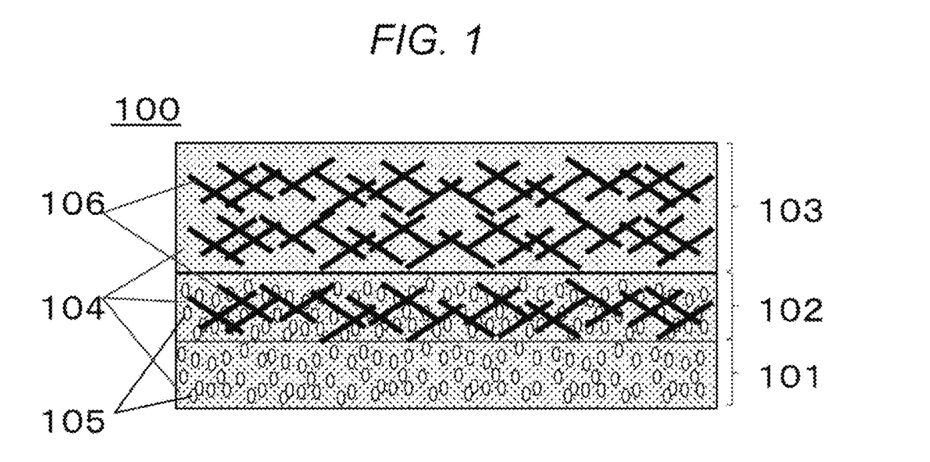
FIG. 1 is a cross-section diagram that shows a structure of a heat-insulation material with a radiation-preventing function according to an embodiment.

FIG. 1 is a cross-section of the heat-insulation material 100 according to a first embodiment, having a radiation-preventing function. The heat-insulation material 100 has a three-layer structure. Ingredients included in respective layers are shown in Table 1.

A first, heat-insulation layer 101 includes a silica xerogel 104 and a radiation-preventing material 105.

A second heat-insulation layer 102 includes a silica xerogel 104, a radiation-preventing material 105, and fibers 106. A third heat-insulation layer 103 includes a silica xerogel 104, and fibers 106.

The third heat-insulation layer 103 is a main body (primary component) of the heat insulation material 100. The first heat-insulation layer 101 and the second heat-insulation material 102 suppress radiation of infrared rays from the third heat-insulation layer 103.

TABLE 1

| Layers | Ingredients |
|---|---|
| First heat-insulation layer 101 | A silica xerogel 104, and a radiation-preventing material 105 |
| Second heat-insulation layer 102 | A silica xerogel 104, a radiation-preventing material 105, and fibers 106 |
| Third heat-insulation layer 103 | A silica xerogel 104, and fibers 106 |

First Heat-Insulation Layer 101

In the first-heat insulation layer 101, a radiation-preventing material 10S is included within a silica-xerogel network structure in which silica particles on the scale of about 10 nm are connected to each other via point contact. A thickness of the first heat-insulation layer 101 may be about 1 μm or more. Although it may be preferred that the thickness of the first heat-insulation layer 101 is somewhat larger, the mechanical strength may become lower. When the thickness is about 100 μm or less, any loss of the components included in the first heat-insulation layer 101 would not be caused, and therefore, such a thickness is preferable. When infrared rays are incident on the heat-insulation material 100, at first, the incident infrared rays are scattered by the radiation-preventing material 105 in the first heat-insulation layer 101 to thereby prevent heat transmission therethrough.

In addition, the first heat-insulation layer 101 does not include the fibers 106. Furthermore, preferably, the first heat-insulation layer 101 does not include any fibers including the fibers 106. This is because, if the fibers 106 are present therein, the heat conductivity will be improved, and thus, the heat-insulation performance will be deteriorated. Furthermore, that is also because the fibers 106 will absorb infrared rays, and then, release them.

Second Heat-Insulation Layer 102

The second heat-insulation layer 102 has a thickness of about 0.1 mm to about 5 mm, and prevents release of the infrared rays, together with the first heat-insulation layer 101. A difference between the second heat-insulation layer 102 and the first heat-insulation layer 101 is that the second heat-insulation layer 102 includes the fibers 106. Since the second heat-insulation layer 102 includes the fibers 106, it has higher mechanical strength.

If the thickness of the second heat-insulation layer 102 is increased, an amount of the radiation-preventing material 105 required therein will be increased, and thus, costs therefor would be increased.

Meanwhile, since the fibers 106 are present in the second heat-insulation layer 102, a certain amount of the infrared rays is absorbed by the fibers 106. For this reason, the first heat-insulation layer 101, which does not include the fibers 106 (or which does not include any fibers in general), is provided to scatter a larger amount of the infrared rays.

The second heat-insulation layer 102 mechanically joins the first heat-insulation layer 101 and the third heat-insulation layer 103. Furthermore, the second heat-insulation layer 102 also suppresses absorption and radiation of infrared rays to some extent. In addition, the second heat-insulation layer 102 is not indispensable. However, the presence thereof is preferable. Heat-insulation properties can be secured by the third heat-insulation layer 103, and scattering of infrared rays, and prevention of the heat transmission can be ensured by the first heat-insulation layer 101. The second heat-insulation layer 102 reinforces these functions, and rigidly joins the first heat-insulation layer 101 and the third heat-insulation layer 103.

Third Heat-Insulation Layer 103

The third heat-insulation layer 103 is a main body of the heat-insulation material 100. A thickness thereof would be determined by a heat conductivity of solids, and a heat conductivity of connective gases (other than conductivities based on radiations thereof) that are calculated for the heat-insulation material 100, and may be from about 0.1 mm to several millimeters.

Heat-Insulation Material 100

The silica xerogels 104 in the first heat-insulation layer 101, the second heat-insulation layer 102, and the third heat-insulation layer 103 say be different types of silica xerogels. However, they are preferably the same type of silica xerogels.

Furthermore, the radiation-preventing materials 105 in the first heat-insulation layer 101 and the second heat-insulation layer 102 may be different types of radiation-preventing materials. However, they are preferably the same type of radiation-preventing materials.

Additionally, the fibers 106 in the second heat-insulation layer 102 and the third heat-insulation layer 103 may be different types of fibers. However, they are preferably the same type of fibers.

It is preferable that the first heat-insulation layer 101, the second heat-insulation layer 102, and the third heat-insulation layer 103 become thicker in this order. This is because the thickness of the first heat-insulation layer 101 cannot be made very large, and therefore, it is required that heat-insulation properties are secured by the third heat-insulation layer 103.

Silica Xerogel 104

The silica xerogel 104 is made of a dehydrated condensate produced in the following way. That is, water glass (aqueous sodium silicate solution), serving as a starting material, is subjected to an ion-exchange process based on an ion-exchange resin, or an electrodialysis process, thereby producing a silicic acid solution with sodium eliminated therefrom, and a base is added to the silicic acid solution to produce the above dehydrated condensate. Alternatively, the silica xerogel 104 is made of a dehydrated condensate produced by adding an acid to a high molarity basic sodium having a particle diameter intermediate between water glass and colloidal silica (i.e., 1 to 10 nm).

The silica xerogel 104 has a mean pore size of about 10 nm to about 55 nm, and a pore volume of about 3.0 cc/g to about 10 cc/g. The mean pore size is preferably from about 10 nm to about 55 nm. If the mean pore size is smaller than 10 nm, the bulk density of the xerogel becomes larger, and, consequently, a proportion of solid heat-transmitting components (silica particles) may be increased. Therefore, in that case, a value of the heat conductivity may become larger. If the mean pore size is larger than 55 nm, the bulk density of xerogel becomes smaller. In that case, although the proportion of the solid heat-transmitting components is decreased, a proportion of pores present in the xerogel would be increased. Consequently, influences by convection of the air (nitrogen molecules) therein may be significant, and the value of the heat conductivity may be increased.

The pore volume is preferably from about 2.5 cc/g to about 10 cc/g. If the pore volume is smaller than 2.5 cc/g, the proportion of the solid heat-transmitting components will be increased in the same manner as the case where the mean pore size is smaller than 10 nm. Therefore, the value of the heat conductivity would be increased. If the pore volume is larger than 10 cc/g, although the proportion of the solid heat-transmitting components is decreased, a proportion of pores present in the xerogel would be increased. Consequently, influences by convection of the air (nitrogen molecules) therein may be significant, and the value of the heat conductivity may be increased.

When the mean pore size and the pore volume of the silica xerogel 104 are within the above ranges, the resulting heat-insulation material 100 will have excellent heat-insulation properties, and therefore such a heat-insulation material 100 would be suitable for heat-insulation purposes. Thus, the above-mentioned ranges are preferable.

A silicate concentration of water, glass serving as a starting material, a type (e.g., pH, dispersing media, particle diameters, particle shapes, particle concentrations) and an amount of basic colloidal silica that is used for the solation, conditions (temperature and time) for gelatinization of the sol, and aging conditions (temperature and time), etc. are somehow adjusted to thereby easily control the mean pore size and the pore volume of the silica xerogel 104.

For preparation of the silica xerogel 104, water glass (aqueous sodium silicate solution) is used as a starting material, and therefore, the preparation process of the silica xerogel 104 can be controlled by adjusting a silicate concentration of the water glass, and a type and a concentration of an acid used for the gelatinization step, and conditions (e.g., temperature, time, pH) for the gelatinization step. Moreover, the preparation process can be controlled by adjusting conditions for the hydrophobization step (e.g., an amount of a silylating agent, an amount of a solvent, temperature, time). Furthermore, the preparation process can be controlled by adjusting conditions for the drying step (e.g., drying temperature, time).

Radiation-Preventing Material 105

With regards to a form of the radiation-preventing material 105, a filler having a high refraction index and a high infrared reflectance (e.g., titanium oxide) can be used. In a case where titanium oxide is used therefor, those having a primary mean, particle diameter of about 1 μm is preferably used in order to block infrared rays with wavelengths of about 2 μm or less.

Fibers 106

With regards to forms of the fibers 106, glass wool, rock wool, and alumina fibers are preferable in terms of heat-insulation properties, heat resistance, flame retardance, and dimension stability. Carbon fibers have high heat conductivities and poor heat-insulation properties, and therefore, are not preferable. A fiber diameter of glass wool, rock wool, or alumina fibers may be from about 1 μm to about 20 μm, and a fiber length thereof may be from about 3 mm to about 25 mm. Fibers that fall within these ranges would have smaller heat conductivities, and therefore, are preferable. Fibers that, have fiber diameters and fiber lengths falling within these ranges would have a heat conductivity within a range from about 0.03 W/mK to about 0.05 W/mR where the heat conductivity is solely on the basis of unwoven fabrics.

If the fiber diameter becomes larger than 20 μm, or the fiber length becomes larger than 25 mm, a proportion of the solid heat-transmitting component of the inorganic fibers would be increased, and thus, the heat conductivity may become larger than 0.05 W/mK. Consequently, even if the silica xerogel 104 is included in the fibers, the heat conductivity of the resulting heat-insulation material may exceed 0.025 W/mK, and this is not preferable.

If fibers having a fiber diameter smaller than about 1 mm and a fiber length smaller than about 3 mm are employed, tangles of fibers may significantly be reduced. Consequently, it may become impossible to maintain a form of sheet, and thus, it is not preferable.

Heat-Insulation Material 100 on the Whole

Proportions of the radiation-preventing materials 105 in the first heat-insulation layer 101 and the second heat-insulation layers 102, respectively, are preferably the same.

Weight-based ratios of the components in the second heat-insulation layer 102 are as follows. (Silica aerogel):(radiation-preventing material):(fibers)=(35-60):(5-20):(20-55).

Weight-based ratios of the components in the third heat-insulation layer 103 are as follows. (Silica aerogel):(fibers)=(40-75):(25-60).

Weight-based ratios of the components in the first heat-insulation layer 101 are as follow. (Silica aerogel):(radiation-preventing material)=(70-95):(5-30).

The presence of about 5% or more of the radiation-preventing material would bring about advantageous effects. If the ratio of the radiation-preventing material exceeds 30%, the solid heat conductivity would be increased, and therefore, the ratio is preferably from, about 10% to about 20%.

The second heat-insulation layer 102 and the third heat-insulation layer 103 preferably includes the same type of a silica xerogel. Weight-based ratios of silica xerogel to fibers are preferably the same between the second heat-insulation layer 102 and the third heat-insulation layer 103.

Method for Producing the Heat-Insulation Material 100

The method for producing the heat-insulation sheet includes the following steps (i) to (vii): (i) a sol-preparation step; (ii) a penetration step; (iii) a gelatinization step; (iv) an aging step; (v) an aqueous-acid-penetration step; (vi) a hydrophobization step; and (vii) a drying step. Each of the steps will be described below.

(i) Sol-Preparation Step

In the sol-preparation step, as a starting material, water glass may be used, or a high molarity basic sodium may be used. In the case in which water glass is used as a starting material, sodium present in water glass is removed with an ion-exchange resin or by electrodialysls, is acidified, and thus, is converted into a sol. Then, by addition of a base serving as a catalyst, the sol is subjected to a polycondensation process to produce a hydrogel. In the case in which a high molarity basic sodium, (e.g., high-malar-ratio sodium silicate aqueous solution) is used as a starting material, the high molarity basic sodium is subjected to a polycondensation process by addition of an acid serving as a catalyst, thereby producing a hydrogel.

To prepare the first heat-insulation layer 101 and the second heat-insulation layer 102, a radiation-preventing material 105 is added to the water glass, or the high molarity basic sodium. A proportion of the radiation-preventing material 105 added thereto is preferably from about 5 wt % to 40 wt % relative to the content of silicates. If the proportion is smaller than 5 wt %, effects to scatter Infrared rays may be reduced, and thus, effects to suppress influences of the radiation may be reduced. On the other hand, if the proportion is larger than 40 wt %, the solid heat conductivity may be increased, by effects of the radiation-preventing material added thereto.

(ii) Penetration Step

The sol solution prepared in Step (i) is caused to penetrate into at least one piece of unwoven fabrics (e.g., glass wool, rock wool) 0.2-1.0 mm thick, by way of pouring, onto the unwoven fabric, 6.5 to 10 time the amount of the sol solution to the unwoven fabric in terms of weight.

At first, a sol that is prepared from the sol solution obtained in Step (i) and that includes a radiation-preventing material is caused to penetrate into at least one piece of fabrics to prepare the first heat-insulation layer 101 and the second heat-insulation layer 102 (first penetration step). As an example of the penetration method, the sol solution may be coated onto a film or the like at a certain thickness, and then, the coated surface is covered with the unwoven, fabrics to thereby cause the coated sol solution to penetrate into the unwoven fabrics. Furthermore, a sol solution that is prepared from, the sol solution obtained in Step (i) and that does not include the above radiation-preventing material 105 (or does not include any radiation-preventing materials in general) is caused to penetrate into the unwoven fabrics from the surface into which the preceding sol solution has been penetrated, thereby preparing the third heat-insulation layer 103 (second penetration step).

When the total thickness of the first heat-insulation layer 101 and the second heat-insulation layer 102 is adjusted to be 10% of the thickness of the heat-insulation material 100, a ratio of the sol solution (b) including the radiation-preventing material 105 to the sol solution (c) not including the radiation-preventing material 105 (b:c) should be 10:90. When the total thickness is adjusted to be 20% of the thickness of the heat-insulation material 100, the ratio should be 20:80.

According to the above adjustment, a part of the sol solution (b) including the radiation-preventing material 105 is not remained in the fibers 106, and is released to the outside from the lower side of the fibers 106. Based on the sol solution released to the outside, the first heat-insulation layer 101 is formed (coating step). Meanwhile, the second heat-insulation layer 102 is formed in a part of the fibers 106 that the sol solution (b) including the radiation-preventing material 105 has penetrated into and has remained in. The third heat-insulation layer 103 is formed over the second heat-Insulation layer 102 by the sol solution (c) not including the radiation-preventing material 106.

In addition, to produce a heat-insulation material 100 in which no second heat-insulation layer 102 is provided, one side of the above third heat-insulation layer 103 may be soaked slightly into the sol solution prepared in Step (i). In that case, subsequent steps may be the same as the case in which the second heat-insulation layer 102 is provided.

(iii) Gelatinization Step

After Step (ii), the sol solutions are gelatinised. A temperature for gelatinization of the sol solutions (gelatinization temperature) is preferably from about 20° C. to about 90° C. If the geiatinization temperature is less than 20° C., a required amount of heat may not be transmitted to silicate monomers that serve as active species for the reaction. Accordingly, growth of silica particles may not sufficiently be promoted. As a result, it may require a prolonged period of time until the gelatinization of the sol solutions sufficiently proceeds. Additionally, mechanical strength of the produced gels (hydrogels) may be low, and may significantly shrink during the drying step, and therefore, hydrogels 104 having desired strength may net be obtained.

On the other hand, if the gelatinization temperature exceeds 90° C., growth of silica particles may excessively be promoted. As a result, volatilization of water may rapidly occur, and a phenomenon in which water and the hydrogels are separated from each other may be observed. Accordingly, volumes of the resulting hydrogels may be reduced, and desired silica xerogels 104 may not be obtained.

In addition, although the gelatinization time varies with the gelatinization temperature, and a time for the aging step carried out after the gelatinization step described below, the sum of the gelatinization time and the aging time mentioned below is preferably from about 0.1 hour to about 12 hours, and is more preferably from about 0.1 to 1 hour since excellent performance (heat conductance) and production cycle time are simultaneously ensured.

In cases where the gelatinization time is longer than 12 hours, not only the productivity may be impaired, but also shrinkage of the gels may be caused, and this results in an increase in the bulk density, if a prolonged time is spent on the aging step, although reinforcement of the silica network would sufficiently be achieved. Therefore, in that case, a problem that the heat conductivity may excessively be increased may arise.

In the above-described manner, the gelatinization and aging steps are carried out to thereby obtain hydrogels that have gel walls with improved mechanical strength and rigidity and that thus hardly shrink during the drying step.

(iv) Aging Step

The aging step aims at converting the obtained gels to hydrogels having reinforced silica skeletons, after the gelatinization. A temperature for the aging step (aging temperature) is preferably from about 50° C. to about 100° C. If the aging temperature is lower than 50° C., the dehydration/condensation reaction relatively slowly proceeds. Therefore, it may become difficult to sufficiently reinforce the silica network within a tact time targeted in view of the productivity.

If the aging temperature is higher than 100° C., water in the gels may be significantly evaporated, shrinkage and drying of the gels may excessively proceed, and thus, the heat conductivity may excessively be increased.

The aging time is preferably from about 0.1 hour to about 12 hours, and is more preferably from about 0.1 hour to about 1 hour since such an aging time can realize excellent performance (heat conductance) and production cycle time.

In cases where the aging time is longer than 12 hours, not only the productivity may be impaired, but also shrinkage of the gel may be caused, and this results in an increase in the bulk density, if a prolonged time is spent on the aging step, although reinforcement of the silica network would sufficiently be achieved. Therefore, a problem that the heat conductivity may excessively be increased may arise.

When the aging time is adjusted within a range from about 0.1 hour to about 6 hours, a network of silica particles can sufficiently be reinforced while sufficient productivity is secured.

(v) Acidic-Aqueous-Solution-Soaking Step

The gel sheet is soaked into aqueous hydrochloric acid (6-12 N), and then, the gel sheet is allowed to stand at an ordinary temperature (23° C.) for 45 minutes or more to cause the aqueous hydrochloric acid to penetrate into the gel sheet.

(vi) Hydrophobication Step

The gel sheet is soaked, for example, in a mixture solution of octamethyltrisiloxane (serving, as a silylating agent) and 2-propanol (IPA; an alcohol), and this is reacted in a thermostatic chamber at about 55° C. for about 2 hours. When formation of trimethylsiloxane bonds starts, the aqueous hydrochloric acid is discharged from the gel sheet, and thus, the liquid phase is separated into two liquids (siloxane as the upper layer and aqueous hydrochloric acid as the lower layer).

(vii) Drying Step

The gel sheet is transferred into a thermostatic chamber at about 150° C., and is dried therein, for about 2 hours.

Example 1

A high molarity basic sodium (TOSO SANGYO CO., LTD.) was converted into a sol solution. Based on the obtained solution, a sol solution that included titanium oxide (TAYCA CORPORATION) serving as a radiation-preventing material 105, and a sol solution that did not include any radiation-preventing materials 105 were prepared, and were used at a ratio of 1:2 to form, a first heat-insulation layer 101, a second heat-insulation layer 102, and a third heat-insulation layer 103, based on the above-described method. A proportion of the radiation-preventing material 105 added, to the sol solution was 30 parts by weight relative to the amount of silicates.

The weight-based ratio of components for the second heat-insulation layer 102 was as follows. That is, (silica aerogel):(radiation-preventing material):(fibers)=55:18:27.

The wsight-based ratio or components for the third heat-insulation layer 103 was as follows. That is, (silica aerogel): (fibers)=67:33.

Figure 2:
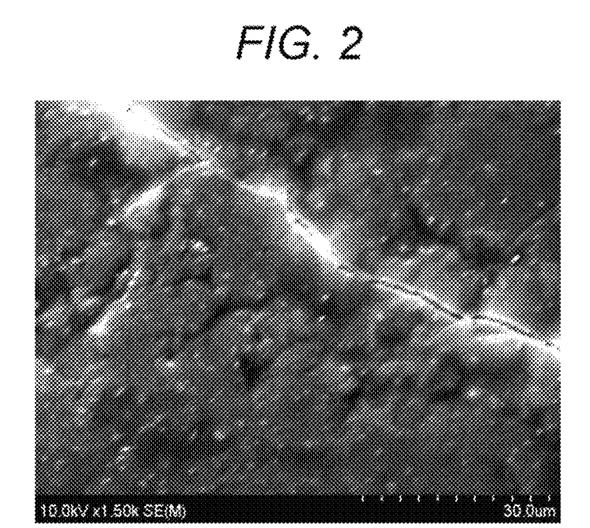
FIG. 2 is a diagram that shows a scanning electron micrograph of a surface of a first heat-insulation layer in an embodiment.

FIG. 2 shows a scanning electron microscopical image in which a surface of the first heat-insulation 101 was observed (1,500-fold magnification). It is found that titanium oxide serving as the radiation-preventing material 105 is scattered as white spots over the silica xerogel 104.

Figure 3:
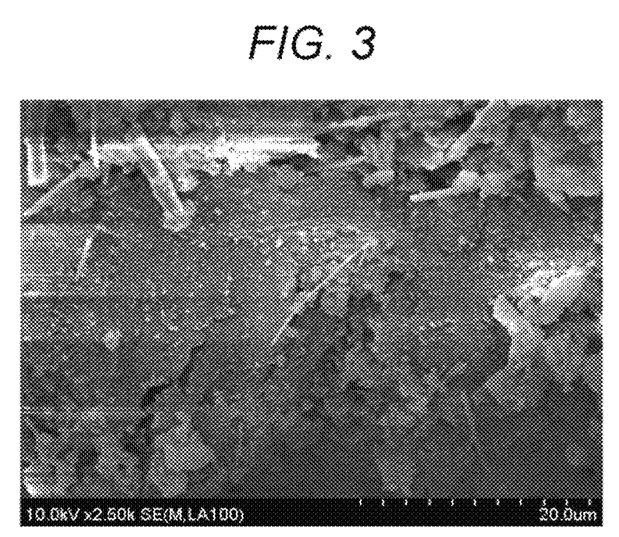
FIG. 3 is a diagram that shows a scanning electron micrograph in which a surface of a second heat-insulation layer was observed in an embodiment.

FIG. 3 shows a scanning electron microscopical image in which a surface of the second heat-insulation 102 was observed (2,000-fold magnification). It is found that titanium oxide serving as the radiation-preventing material 105 is scattered as white spots over the silica xerogel 104, and that fibers 106 are further present therein.

Figure 4:
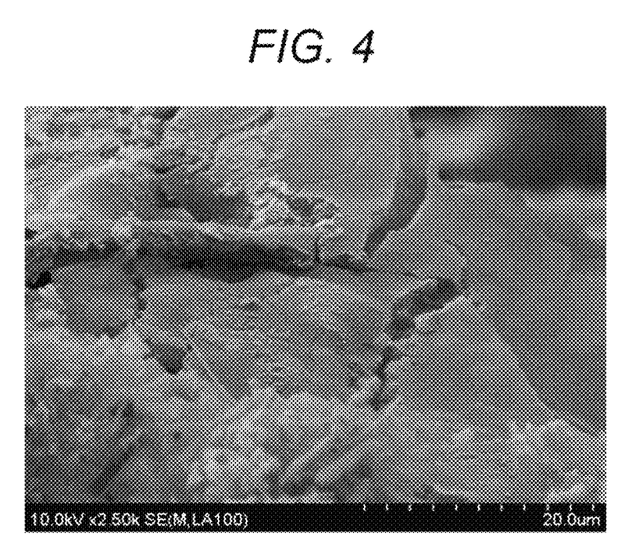
FIG. 4 is a diagram that shows a scanning electron micrograph in which a surface of a third heat-insulation layer was observed in an embodiment.

FIG. 4 shows a scanning electron microscopical image in which a surface of the third heat-insulation 103 was observed (2,000-fold magnification). Although fibers 106 are present in the silica xerogel 104 in FIG. 4, it is found that any titanium oxide is not present therein, while titanium oxide is recognized, as white spots over in FIGS. 2 and 3.

Comparative Example 1

A high molarity basic sodium (TOSO SANGYQ CO., LTD.) was converted into a sol solution. Based on the obtained sol solution, a sol solution that included titanium oxide (TAYCA CORPORATION) serving as a radiation-preventing material 105 was prepared, and, based on this sol solution, a heat-insulation material (single-layer structure) that uniformly included the radiation-preventing material 105 was produced. A proportion, of the radiation-preventing material 105 added thereto was adjusted to 10 parts by weight relative to the amount of silicates, and the same amount of titanium oxide as EXAMPLE 1 was used.

Advantageous Effects Brought about by the Heat-Insulation Material 100

In order to compare heat-Insulation performance between EXAMPLE 1 AND COMPARATIVE EXAMPLE 1, both of the produced heat-insulation materials were heated on a hot plate, and temperatures of the front surfaces and the back surfaces were measured with a thermoelectric couple. Then, differences between the measured temperatures were confirmed. The heat-insulation material in EXAMPLE 1 had a structure shown in FIG. 1, and the first heat-insulation layer 101 was brought into contact with the hot plate.

Figure 5:
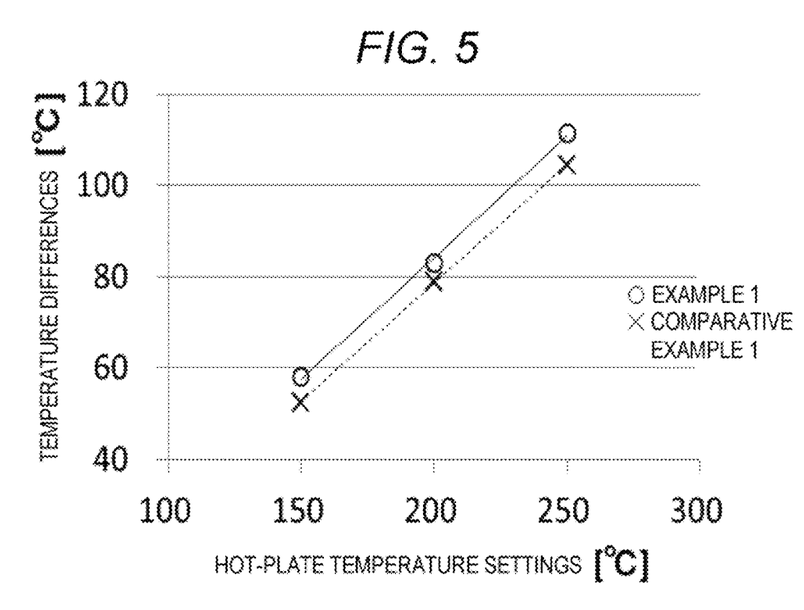
FIG. 5 is a diagram that shows results of comparison of temperature differences between EXAMPLE 1 and COMPARATIVE EXAMPLE 1.

The results are shown in FIG. 5. Based on the results shown in FIG. 5, it is revealed that heat-insulation effects observed in the product of EXAMPLE 1 are superior to those observed in the product of COMPARATIVE EXAMPLE 1.

That is, according to the structure shown in FIG. 1, since the radiation-preventing material 105 is included inside the silica xerogel 104, loss of the radiation-preventing material 105 can be prevented. By adding the radiation-preventing material 105 to the surface layer (first heat-insulation layer) that is a component layer of the heat-insulation material and that is located near the heat source, scattering of infrared rays can be prevented in the surface layer area. Accordingly, since infrared rays never penetrate into the internal area of the heat-insulation material, heat transmission through the heat-insulation material can effectively be suppressed, and it becomes possible to provide a heat-insulation material having an excellent radiation-preventing function. Thus, it becomes possible to provide a heat-insulation material having excellent heat-insulation performance.

Applications of the Heat-Insulation Material to an Electronic Device 109

Figure 6:
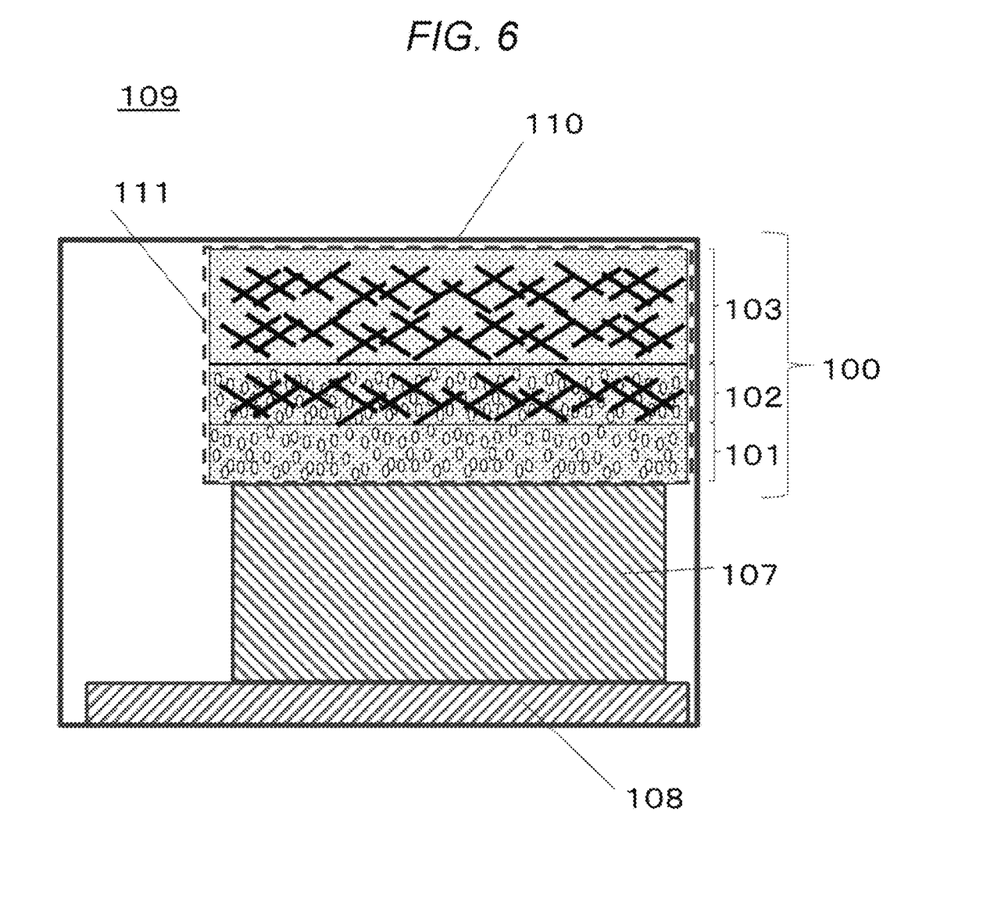
FIG. 6 is a cross-section diagram that shows one example of an electronic device in which a heat-insulation material according to an embodiment is employed.

One example of an electronic device 109 in which the above-described heat-insulation material 100 is employed will now be described with reference to FIG. 6. FIG. 6 shows an electronic device 109 according to an embodiment. There is a heat-generating component 107 that is mounted on a circuit substrate 108. The above heat-insulation material 100 is located on the heat-generating component 107. The heat-insulation material 100 does not transmit any heat generated from the heat-generating component 107 to an exterior frame 110. Therefore, even if persons touch the exterior frame 110, there will be no harm (e.g., no low-temperature burn injuries) to them.

The first heat-insulation layer 101 is somehow located in the heat-insulation material 100 so as to be placed on the side of the heat-generating component 107. In addition, the heat-insulation material 100 is preferably covered with a thin resin-made film 111 for use. If the heat-insulation material 100 is covered with the film 111, its handleability would be improved.

General Structure

The above-described heat-insulation material 100 is placed inside an electronic device such that the first heat-insulation layer 101 is adjacent to a heat-generating component.

Heat-insulation materials according to the disclosure will be employed as a wide range of heat-insulation applications. In particular, the heat-insulation materials can be employed at about 100° C. or higher, i.e. at a temperature range where radiation-based heat transmission is dominant. The heat-insulation materials can be employed for the purposes of heat insulation in various apparatuses.

What is claimed is:

1. A heat-insulation material, comprising:
   a first heat-insulation layer that includes a first silica xerogel and a first radiation-preventing material; and
   a third heat-insulation layer that includes a third silica xerogel and second fibers, wherein the first heat-insulation layer and the third heat-insulation layer are layered,
   wherein the first silica xerogel and the third silica xerogel have a mean pore size of about 10 nm to about 55 nm, and a pore volume of about 3.0 cc/g to about 10 cc/g.

2. A heat-insulation material, comprising:
   a first heat-insulation layer that includes a first silica xerogel and a first radiation-preventing material;
   a third heat-insulation layer that includes a third silica xerogel and second fibers, wherein the first heat-insulation layer and the third heat-insulation layer are layered; and
   a second heat-insulation layer that includes a second xerogel, a second radiation-preventing material, and first fibers, wherein the second heat-insulation layer is placed between the first heat-insulation layer and the third heat-insulation layer.

3. The heat-insulation material according to claim 2, wherein the first heat-insulation layer does not include the same type of fibers as the first fibers.

4. The heat-insulation material according to claim 2, wherein the first heat-insulation layer does not include any fibers.

5. The heat-insulation material according to claim 2, wherein the first fiber and the second fiber are the same type of fibers.

6. The heat-insulation material according to claim 2, wherein the first radiation-preventing material and the second radiation-preventing material are the same type of radiation-preventing materials.

7. The heat-insulation material according to claim 2, wherein the first heat-insulation layer and the second heat-insulation layer are each thinner than the third heat-insulation layer.

8. The heat-insulation material according to claim 2, wherein the first heat-insulation layer, the second heat-insulation layer, and the third heat-insulation layer become thicker in this order.

9. An electronic device, comprising:
   a circuit substrate;
   a heat-generating component that is placed on the circuit substrate; and
   the heat-insulation material according to claim 1, wherein the heat-insulation material is placed such that the first heat-insulation layer faces the heat-generating component.

10. A method for producing a heat-insulation material, comprising:
   (i) converting water glass or a silicic acid solution to a sol (a), and, providing a sol (b) that is prepared from the sol (a) and that includes a radiation-preventing material (p), and a sol (c) that is prepared from the sol (a) and that does not include the radiation-preventing material (p);
   (ii) causing the sol (b) and the sol (c) to penetrate into at least one piece of unwoven fabrics;
   (iii) converting the sol (b) and the sol (c) into gels;
   (iv) aging the gels;
   (v) soaking the gels in an acidic aqueous solution;
   (vi) hydrophobizing the gels; and
   (vii) drying the gels,
   wherein the gels have a mean pore size of about 10 nm to about 55 nm, and a pore volume of about 3.0 cc/g to about 10 cc/g.

* * * * *